(12) United States Patent
Ryu

(10) Patent No.: US 7,794,898 B2
(45) Date of Patent: Sep. 14, 2010

(54) METHOD OF FABRICATING PHOTOMASK

(75) Inventor: Jin Ho Ryu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 337 days.

(21) Appl. No.: 12/104,935

(22) Filed: Apr. 17, 2008

(65) Prior Publication Data

US 2009/0111033 A1   Apr. 30, 2009

(30) Foreign Application Priority Data

Oct. 31, 2007   (KR) .................. 10-2007-0110493

(51) Int. Cl.
   *G03F 1/00*   (2006.01)
(52) U.S. Cl. ........................................................ 430/5
(58) Field of Classification Search ............... 430/5, 430/322, 323, 324, 394
   See application file for complete search history.

(56) References Cited

U.S. PATENT DOCUMENTS

2006/0234137 A1   10/2006   Kim
2006/0257753 A1   11/2006   Kim et al.
2006/0266478 A1*  11/2006   Lee et al. ............... 156/345.24

FOREIGN PATENT DOCUMENTS

KR   10-1999-0029567   4/1999
KR   10-2002-0051109   6/2002
KR   10-2008-0095153   10/2008

* cited by examiner

*Primary Examiner*—Stephen Rosasco
(74) *Attorney, Agent, or Firm*—Marshall, Gerstein & Borun LLP

(57) ABSTRACT

A method for fabricating a photomask includes forming a phase shift layer and a light blocking layer on a transparent substrate, forming a light blocking pattern including a space through which the phase shift layer is selectively exposed by etching light blocking layer, forming a resist pattern to fill the space, reducing a critical dimension (CD) of the resist pattern by irradiating ultraviolet (UV) rays onto the resist pattern, forming a phase shift pattern by etching the phase shift layer exposed during the reducing of the CD of the resist pattern using the reduced resist pattern and the light blocking pattern as an etch mask, and removing the resist pattern.

8 Claims, 6 Drawing Sheets

METHOD OF FABRICATING PHOTOMASK

CROSS-REFERENCE TO RELATED APPLICATION

Priority to Korean patent application number 10-2007-0110493, filed on Oct. 31, 2007, the disclosure of which is incorporated by reference in its entirety, is claimed.

BACKGROUND OF THE INVENTION

The invention relates to a semiconductor device and, more particularly, to a method for fabricating a photomask.

A pattern including a light blocking layer or a phase shift layer on a substrate is transferred onto a wafer using a photomask as a mask to form a desired pattern on the wafer. In the past, a binary mask has generally been used as the photomask. In the binary mask, the desired pattern is formed as the light blocking pattern on the substrate, and transmitted light passes through the substrate to transfer the desired pattern onto a wafer. However, as the degree of integration of semiconductor devices increases, a wafer that can form a finer pattern than the binary mask on the wafer is required. A phase shift mask that can form a finer pattern on the wafer using a phase shift material having a transmittance of several percent has found widespread use as the photomask.

FIG. 1 illustrates a cross-sectional view of a conventional phase shift mask. Referring to FIG. 1, a phase shift mask includes a phase shift pattern 105 and a light blocking pattern 110 on a transparent substrate 100. A region in which the phase shift pattern 105 is exposed is defined as a phase shift region 115 which shifts the phase of light irradiated onto the substrate 100 during the following exposure process. A region in which the light blocking pattern is exposed is defined as a light blocking region 120 in which the light irradiated onto the substrate 100 is blocked. A region in which the transparent substrate is exposed is defined as a light transmitting region 125 through which the light is passes. The phase shift mask is formed by performing two or more lithography processes using an electron beam (E-beam) exposure unit. There is a limitation that a fine pattern is formed using an E-beam exposure unit because the degree of integration of semiconductor devices increases rapidly. Particularly, a second exposure process using the E-beam exposure unit requires an exposure unit configured to form a finer pattern because accurate pattern alignment is needed. In a laser exposure unit which can form a finer pattern than the E-beam exposure unit, a fabrication process becomes complicated because the laser exposure unit is not adapted to perform a first exposure process. Therefore, there is a need for a method that can form a very fine pattern while simplifying the fabrication process.

SUMMARY OF THE INVENTION

In one embodiment, a method for fabricating a photomask includes sequentially forming a phase shift layer and a light blocking layer on a transparent substrate; etching the light blocking layer to form a light blocking pattern including a space through which the phase shift layer is exposed; forming a resist pattern having a critical dimension (CD) to fill the space exposing the phase shift layer; irradiating ultraviolet (UV) radiation onto the resist pattern to reduce the CD of the resist pattern and to expose the phase shift layer; etching the exposed phase shift layer using the reduced resist pattern and the light blocking pattern as an etch mask to form a phase shift pattern including first and second phase shift patterns having different CDs with respect to each other; and removing the resist pattern to form a photomask including a first phase shift region, a second phase shift region, and a light transmitting region.

The method preferably further includes forming a light blocking pattern with the same CD as the reduced resist pattern by performing an additional etching process on the light blocking pattern after the reducing of the CD of the resist pattern.

Forming the resist pattern preferably includes: forming a positive type photoresist layer on the light blocking pattern; and exposing the light blocking pattern by performing a planarization process on the photoresist layer.

The planarization process preferably includes an etch-back process and a chemical mechanical polishing (CMP) process using $O_2$ plasma.

Forming the resist pattern preferably includes: forming a negative type photoresist layer on the light blocking pattern; exposing the transparent substrate from a back side toward a front side; and forming a photoresist pattern to fill the space by performing a developing process in which the photoresist layer is removed in a region exposed during the exposing of the transparent substrate.

The light blocking pattern preferably has the same CD as the resist pattern to fill the space through which the phase shift layer is exposed. When reducing the CD of the resist pattern, the CD of the resist pattern is preferably reduced to less than approximately half compared to that of the light blocking pattern.

In another embodiment, a method for fabricating a photomask includes: sequentially forming a phase shift layer and a light blocking layer on a transparent substrate; etching the light blocking layer to form a light blocking pattern including a space through which the phase shift layer is exposed; forming a resist pattern having a critical dimension (CD) to fill the space exposing the phase shift layer; irradiating UV radiation onto the resist pattern to reduce the CD of the resist pattern; performing an additional etching process on the light blocking pattern to form a light blocking pattern having the same CD as the reduced resist pattern; etching the exposed phase shift layer using the reduced resist pattern and the light blocking pattern as an etch mask to form a phase shift pattern with the same CD as the reduced resist pattern; and removing the resist pattern to form a photomask including a phase shift region and a light transmitting region.

The light blocking pattern is preferably additionally etched at an etching rate of approximately 1 nm/sec.

DESCRIPTION OF SPECIFIC EMBODIMENTS

Hereinafter, a method for fabricating a photomask in accordance with the invention is described in detail with reference to the accompanying drawings.

Figure 1:
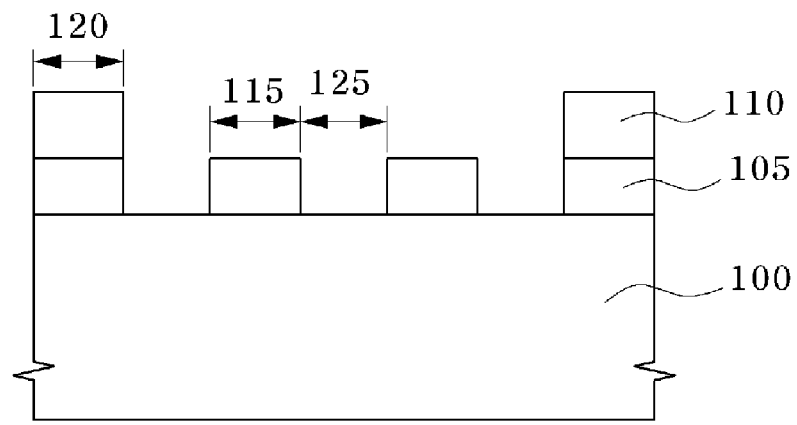
FIG. 1 illustrates a cross-sectional view of a conventional phase shift mask.
Figure 2:
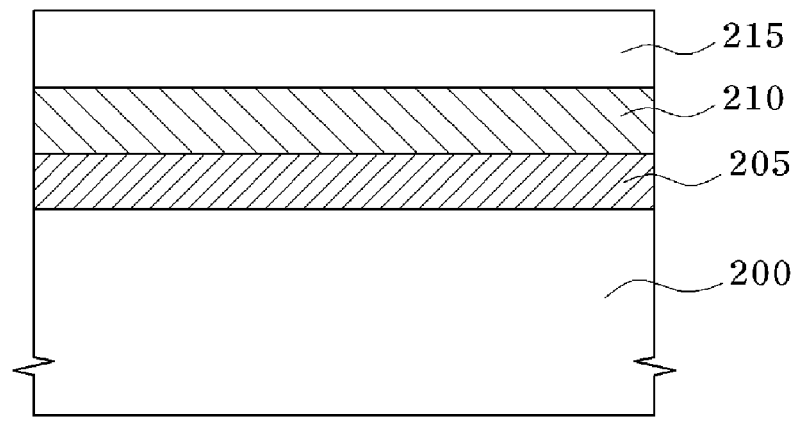
FIGS. 2 to 11 illustrate a process of fabricating a photomask according to one embodiment of the invention.

Referring to FIG. 2, a phase shift layer 205 and a light blocking layer 210 are sequentially formed on a substrate 200. The substrate 200 illustratively comprises quartz and is formed of a transparent material (i.e., a material through which light passes). The phase shift layer 205 formed on the substrate 200 is formed of a material which shifts a phase of light irradiated onto the substrate 200 during the following exposure process. The phase shift layer 205 may be formed of a compound including molybdenum (Mo), e.g., molybdenum silicon oxide nitride (MoSiON), for example. The light blocking layer 210 formed on the phase shift layer 205 blocks light passing through the substrate 200 during the following exposure process. The light blocking layer 210 may be formed of chrome (Cr), for example. A first resist layer 215 is formed on the light blocking layer 210. The first resist layer 215 serves as an etch mask during the following exposure process.

Figure 3:
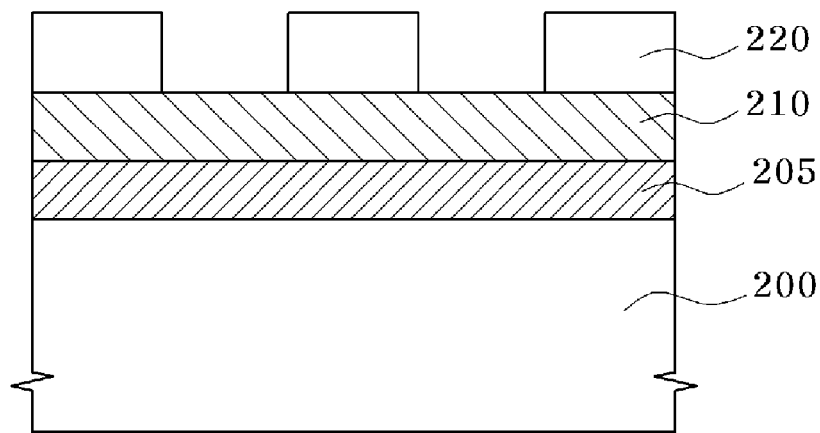

Referring to FIG. 3, a first resist pattern 220 selectively exposing the light blocking layer 210 is formed by patterning the first resist layer 215. Particularly, a lithography process including an exposing process and a developing process may be performed on the first resist layer 215. A difference in solubility is caused by a photochemical reaction in a region in which light is irradiated onto the first resist layer 215. The first resist pattern 220 selectively exposing the light blocking layer 210 is formed by removing the photochemically reacted region using a developing solution. An electron beam (E-beam) exposure unit may be used in the lithography process.

Figure 4:
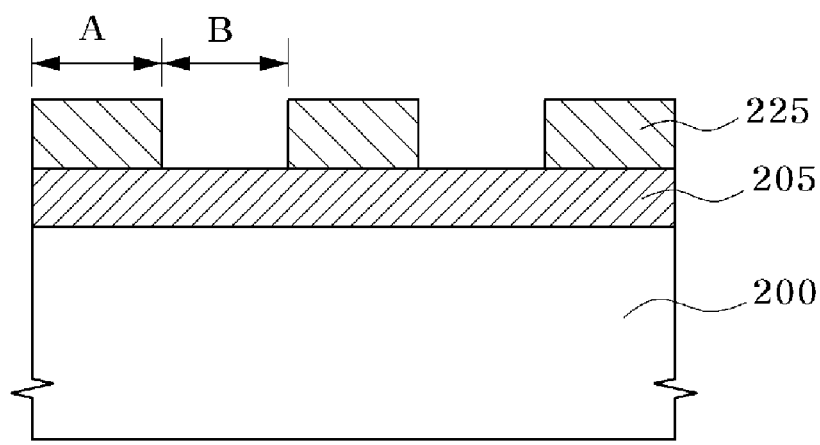

Referring to FIG. 4, a light blocking pattern 210 having a space through which the phase shift layer 205 is exposed is formed by etching the exposed light blocking layer 210 using the first resist pattern 220 as an etch mask. The first resist pattern 220 is then removed. Herein, a critical dimension (CD) "A" of the light blocking pattern 225 and a CD "B" of the space through which is exposed the phase shift layer 205 have the same proportion.

Figure 5:
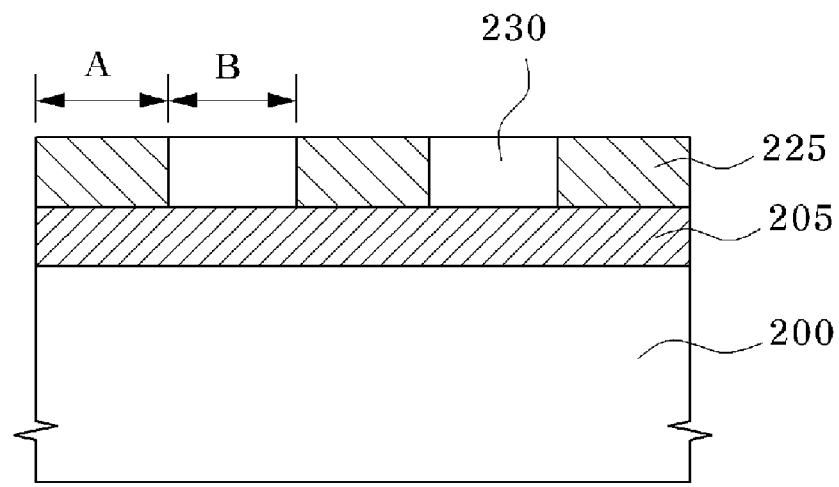

Referring to FIG. 5, a second resist pattern 230 is formed over the substrate 200 to fill the space of the light blocking pattern 225 exposing the phase shift layer 205. Particularly, the second resist layer is formed over the substrate 200. The second resist layer is formed such that it has a thickness enough to be adapted for filling the space between lines of the light blocking pattern 225, for example, a thickness of approximately 3000 Å. The second resist layer serves as a photoresist layer. Illustratively, the second resist layer may be formed of a positive type photoresist material in which a portion irradiated by light during the exposure process is removed by the developing solution. The second resist layer then may be formed of a negative type photoresist material in which the portion irradiated by the light remains. A second resist pattern 230 filling the space between the adjacent lines of the light blocking pattern 225 is formed by selectively removing the second resist layer formed on the light blocking pattern 225. When the second resist layer is formed of the positive type photoresist material, the light blocking pattern 225 is separated from the second resist pattern 230 by performing a planarization process on the second resist layer. The planarization process preferably comprises an etch-back process and a chemical mechanical polishing (CMP) process. When the second resist layer is formed of the negative type photoresist material, a backside exposure process in which light is irradiated from a bottom surface of the substrate 200 toward the second resist layer is performed. When the backside exposure process is performed, a portion of the light irradiated onto the substrate 200 is blocked by the light blocking pattern 225, and the other portion of the light is irradiated onto the second resist layer by transmitting the phase shift layer 205. The developing process is then performed using the developing solution. The second resist pattern 230 filling the space between the lines of the light blocking pattern 225 is formed while the second resist layer formed on the light blocking pattern 225 is removed due to physical properties of the negative type photoresist material in which the portion irradiated by the light remains. The second resist pattern 230 has a CD "B."

Figure 6:
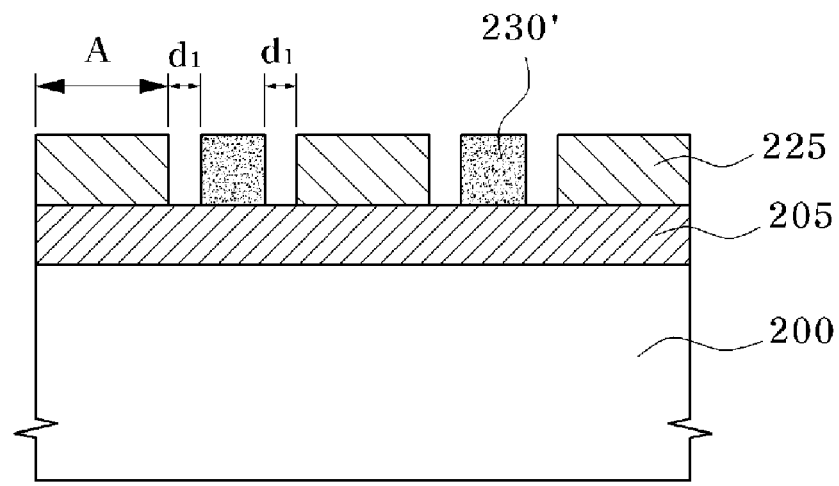

Referring to FIG. 6, a reduced second resist pattern 230' is formed, preferably by irradiating ultraviolet (UV) radiation onto the second resist pattern 230. The second resist pattern 230 in which the CD is reduced by a predetermined width $d_1$ by irradiating ultraviolet (UV) rays onto the substrate 200. A time for which UV rays are irradiated (hereinafter, referred to as "an UV irradiation time") is adjusted such that the CD of the reduced second resist pattern 230' is reduced to less than approximately half compared to the CD "A" of the light blocking pattern 225. The UV irradiation time is adjusted such that the width d1 of the reduced second resist pattern 230' is reduced to less than approximately quarter compared to the CD "A" of the light blocking pattern 225. For example, in case of a line and space pattern in which a half-pitch size is approximately 0.5 nm, a shrink rate of the reduced second resist pattern 230' is maintained at approximately 2.2 nm/min. In case that the recessed second resist pattern 230' is formed to a thickness of approximately 3000 Å, a loss width of the reduced second resist pattern 230' is less than approximately 500 Å, and a remaining width of the reduced second resist pattern 230' is equal to or more than approximately 2500 Å when the UV irradiation time is approximately sixty minutes. Thus, the reduced second resist pattern 230' can serve as an etch mask in the following etching process of the phase shift layer 205. Then, a portion of the phase shift layer 205 is exposed by the reduced second resist pattern 230'.

Figure 7:
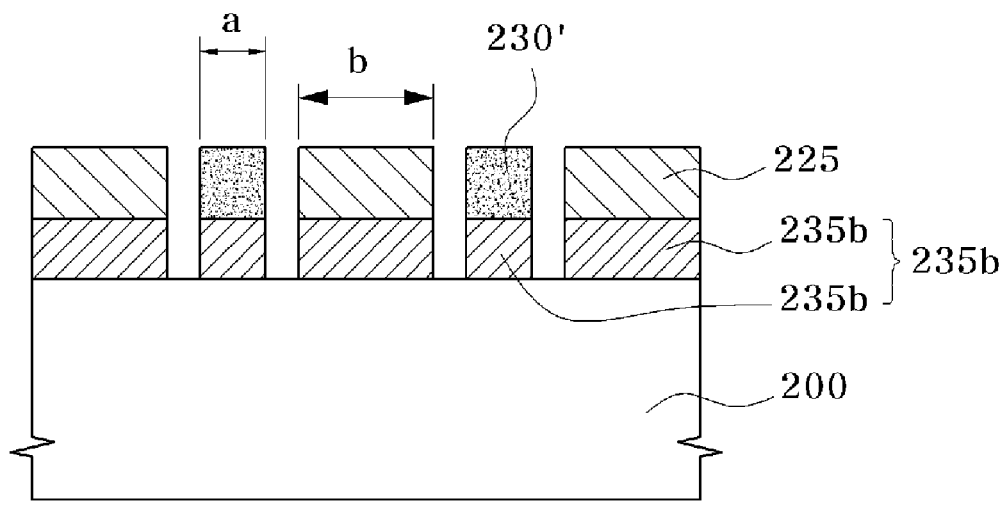

Referring to FIG. 7, a phase shift pattern 235 including a first phase shift pattern 235a and a second phase shift pattern 235b is formed by etching the exposed phase shift layer (refer to FIG. 6) 205 using the reduced second resist pattern 230' and the light blocking pattern 225 as an etch mask. The first phase shift pattern 235a is formed using the reduced second resist pattern 230' as the etch mask. The second phase shift pattern 235b is formed using the light blocking pattern 225 as the etch mask. Hence, in the phase shift pattern 235, a CD "a" of the first phase shift pattern 235a is different from a CD "b" of the second phase shift pattern 235b. An etch bias between the reduced second resist pattern 230' and the first phase shift pattern 235a is approximately 35 nm. For example, when the CD of the reduced second resist pattern 230' reduced by irradiating the UV rays is approximately 100 nm, the CD "a" of the first phase shift pattern 235a formed using the reduced second resist pattern 230' as an etch mask is approximately 135 nm. In the illustrated example, an etch bias between the light blocking pattern 225 and the second phase shift pattern 236b is approximately −4 nm. For example, when the CD of the light blocking pattern 225 is approximately 100 nm, the CD "b" of the second shift pattern 235b formed using the light blocking pattern 225 as the etch mask is approximately 96 nm. After the light blocking pattern 225 is formed with a CD greater than that of a desired pattern, the CD of the desired pattern is ensured by reducing the resist pattern. A process margin for the developing process is ensured in the lithography process. Therefore, it is possible to ensure a process margin for patterns which could not be formed due to the limitation of the developing process.

Figure 8:
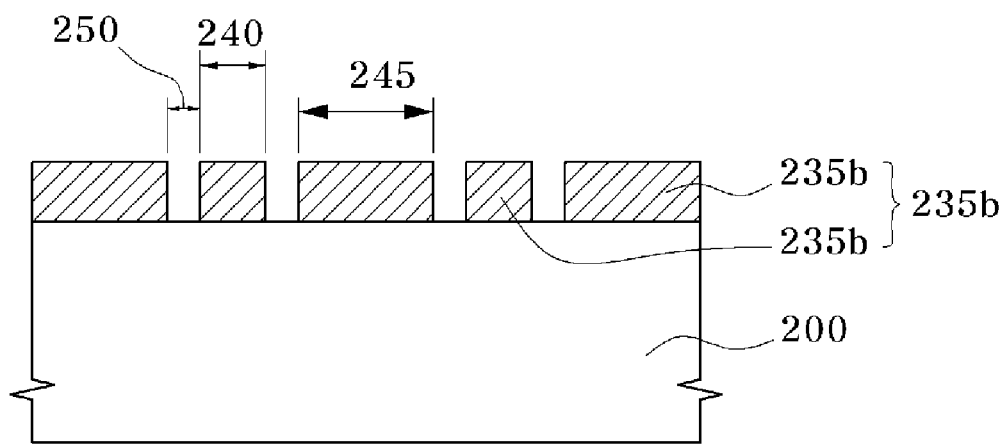

Referring to FIG. 8, the light blocking pattern 225 and the reduced second resist pattern 230' formed on the phase shift pattern 235 are removed. A first phase shift region 240, a second phase shift region 245, and a light transmitting region 250 are defined in the substrate 200. The first phase shift region 240 is defined by the first phase shift pattern 235a. The second phase shift region 245 is defined by the second phase shift pattern 235b. A portion of a top surface of the substrate 200 is exposed through the light transmitting region 250.

A phase shift pattern having the same CD may be formed on the substrate 200. Hereinafter, a method for fabricating the phase shift pattern having the same CD will be described with reference to the accompanying drawings.

Figure 9:
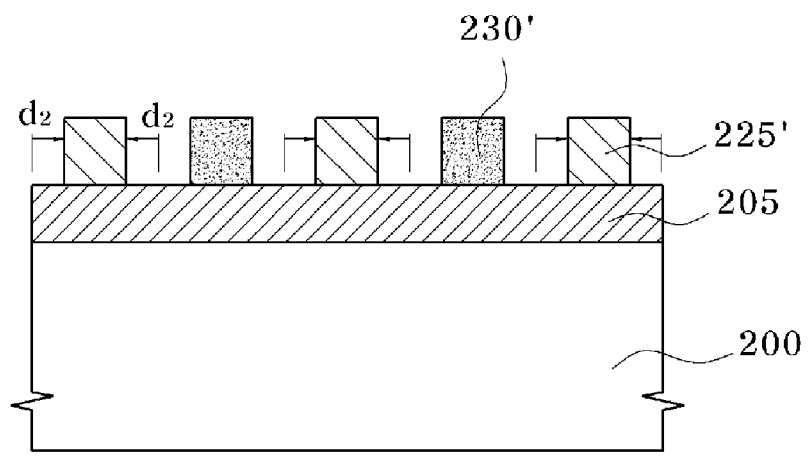
Figure 10:
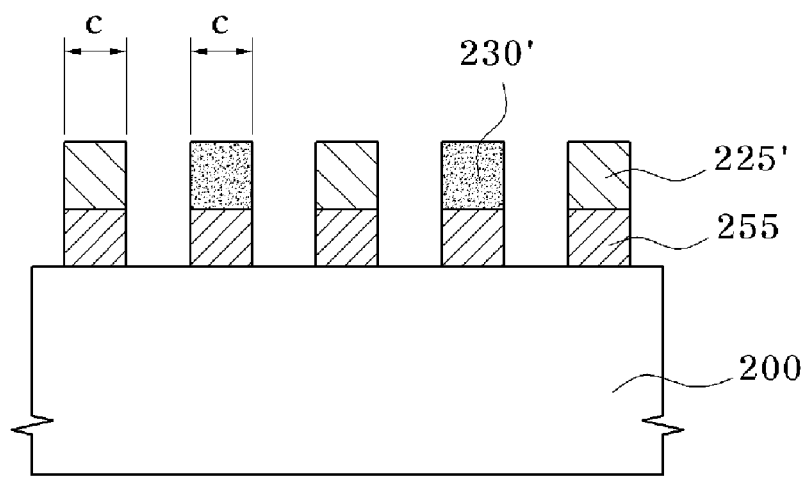
Figure 11:
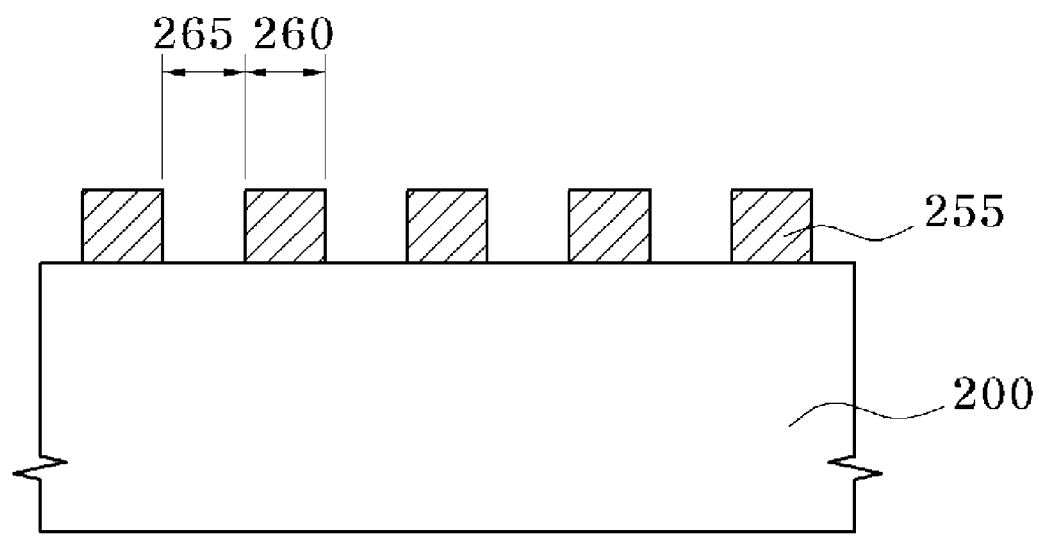

FIGS. 9 to 11 illustrate cross-sectional views of a process of fabricating a phase shift pattern having the same CD. Again referring to FIGS. 2 to 4, the phase shift layer 205 and the light blocking layer 210 are formed on the substrate 200. The light blocking pattern 225 selectively exposing the phase shift layer 205 is formed by performing a first lithography process on the light blocking layer 210. Again referring to FIG. 5, the second resist pattern 230 filling a space through which the phase shift layer 205 is exposed due to the light blocking pattern 225 is formed over the substrate 200 including the light blocking pattern 225. Again referring to FIG. 6, the CD of the reduced second resist pattern 230' is reduced by the predetermined width $d_1$. Then, while maintaining the CD of the light blocking pattern 254, the CD of the reduced second resist pattern 230' is reduced. Hence, the light blocking pattern 225 and the reduced second resist pattern 230' are different in CD.

Referring to FIG. 9, a light blocking pattern 225' reduced by a predetermined width $d_2$ is formed by performing an additional etching process on the light blocking pattern 225. Therefore, the light blocking pattern 225' has the same CD as the second resist pattern 230' due to the additional etching process. Preferably, the light blocking pattern 225' is etched at an etching rate of approximately 1 nm/sec.

Referring to FIG. 10, a phase shift pattern 255 is formed by etching the exposed phase shift layer using the light blocking pattern 225' and the reduced second resist pattern 230' as an etch mask. Lines of the phase shift pattern are arranged with the same width due to the light blocking pattern 225' formed by the additional etching process and the reduced second resist pattern 230'. An etch bias between the reduced second resist pattern 230' and the phase shift pattern 255 is approximately 35 nm. An etch bias between the light blocking pattern 225 and the phase shift pattern 255 is approximately –4 nm. Therefore, in the illustrated example, when the final target phase shift pattern has the same CD of approximately 100 nm, the CD of the light blocking pattern 225' before etching the phase shift layer is approximately 104 nm and the CD of the reduced second resist pattern 230' is approximately 65 nm.

Referring to FIG. 11, the light blocking pattern 225' and the reduced second resist pattern 230' formed on the phase shift pattern 255 are removed. A phase shift region 260 and a light transmitting region 265 are defined in the substrate. The phase shift region 260 is defined by the phase shift pattern 255. A portion of a top surface of the substrate 200 is exposed through the light transmitting region 265. Lines of the phase shift pattern 255 are arranged with the same CD in the phase shift region.

While the invention has been described with respect to the specific embodiments, various changes and modifications may be made without departing from the spirit and scope of the invention as defined in the following claims.

What is claimed is:

1. A method for fabricating a photomask, the method comprising:

sequentially forming a phase shift layer and a light blocking layer on a transparent substrate;

etching the light blocking layer to form a light blocking pattern including a space through which the phase shift layer is exposed;

forming a resist pattern having a critical dimension (CD) to fill the space exposing the phase shift layer;

irradiating ultraviolet (UV) radiation onto the resist pattern to reduce the CD of the resist pattern and to expose the phase shift layer;

etching the exposed phase shift layer using the reduced resist pattern and the light blocking pattern as an etch mask to form a phase shift pattern including first and second phase shift patterns having different CDs with respect to each other; and removing the resist pattern to form a photomask including a first phase shift region, a second phase shift region, and a light transmitting region.

2. The method of claim 1, comprising forming the resist pattern by:

forming a positive type photoresist layer on the light blocking pattern; and performing a planarization process on the photoresist layer to expose the light blocking pattern.

3. The method of claim 2, wherein the planarization process comprises an etch-back process and a chemical mechanical polishing (CMP) process using $O_2$ plasma.

4. The method of claim 1, comprising forming the resist pattern by:

forming a negative type photoresist layer on the light blocking pattern;

exposing the transparent substrate from a back side thereof toward a front side thereof; and forming a photoresist pattern to fill the space by performing a developing process comprising removing the photoresist layer in a region exposed during the exposing of the transparent substrate.

5. The method of claim 1, wherein the light blocking pattern has the same CD as the resist pattern filling the space exposing the phase shift layer.

6. The method of claim 1, wherein the reduced CD of the resist pattern is greater than the CD of the light blocking pattern.

7. A method for fabricating a photomask, the method comprising:

sequentially forming a phase shift layer and a light blocking layer on a transparent substrate;

etching the light blocking layer to form a light blocking pattern including a space through which the phase shift layer is exposed;

forming a resist pattern having a critical dimension (CD) to fill the space exposing the phase shift layer;

irradiating UV radiation onto the resist pattern to reduce the CD of the resist pattern;

performing an additional etching process on the light blocking pattern to form a light blocking pattern having the same CD as the reduced resist pattern;

etching the exposed phase shift layer using the reduced resist pattern and the light blocking pattern as an etch mask to form a phase shift pattern with the same CD as the reduced resist pattern; and removing the resist pattern to form a photomask including a phase shift region and a light transmitting region.

8. The method of claim 7, comprising additionally etching the light blocking pattern at an etching rate of approximately 1 nm/sec.

* * * * *